(12) United States Patent
Kurita et al.

(10) Patent No.: US 8,864,907 B2
(45) Date of Patent: Oct. 21, 2014

(54) SILICON SUBSTRATE AND MANUFACTURING METHOD OF THE SAME

(75) Inventors: Kazunari Kurita, Tokyo (JP); Shuichi Omote, Tokyo (JP)

(73) Assignee: Sumco Corporation, Tokyo (JP)

( * ) Notice: Subject to any disclaimer, the term of this patent is extended or adjusted under 35 U.S.C. 154(b) by 372 days.

(21) Appl. No.: 12/397,399

(22) Filed: Mar. 4, 2009

(65) Prior Publication Data

US 2009/0226737 A1 Sep. 10, 2009

(30) Foreign Application Priority Data

Mar. 5, 2008 (JP) ................. P2008-054842

(51) Int. Cl.
| | | |
|---|---|---|
| *C30B 15/20* | (2006.01) | |
| *H01L 27/146* | (2006.01) | |
| *C30B 15/04* | (2006.01) | |
| *C30B 29/06* | (2006.01) | |
| *C30B 33/02* | (2006.01) | |

(52) U.S. Cl.
CPC .... *H01L 27/14689* (2013.01); *H01L 27/14698* (2013.01); *C30B 15/04* (2013.01); *C30B 15/20* (2013.01); *C30B 29/06* (2013.01); *C30B 33/02* (2013.01)
USPC .............. 117/14; 117/2; 117/3; 117/4; 117/7; 117/11; 117/13; 117/19; 117/20

(58) Field of Classification Search
USPC ...................... 117/2.3, 4, 7, 11, 13, 19, 20, 14
See application file for complete search history.

(56) References Cited

U.S. PATENT DOCUMENTS

| | | | | |
|---|---|---|---|---|
| 5,674,756 A | * | 10/1997 | Satoh et al. | ............... 438/471 |
| 5,734,195 A | | 3/1998 | Takizawa et al. | |

(Continued)

FOREIGN PATENT DOCUMENTS

| | | |
|---|---|---|
| EP | 1780781 | 5/2007 |
| EP | 2061082 | 5/2009 |

(Continued)

OTHER PUBLICATIONS

U.S. Appl. No. 12/396,631, filed Mar. 3, 2009, and entitled "Method of Manufacturing Silicon Substrate".

(Continued)

*Primary Examiner* — Matthew Song
(74) *Attorney, Agent, or Firm* — Greenblum & Bernstein, P.L.C.

(57) ABSTRACT

A condition of a single crystal manufacturing step subjected to the Czochralski method applying an initial oxygen concentration, a dopant concentration or resistivity, and a heat treatment condition is determined simply and clearly on the basis of the conditions of a wafer manufacturing step and a device step so as to obtain a silicon wafer having a desired gettering capability. A manufacturing method of a silicon substrate which is manufactured from a silicon single crystal grown by the CZ method and provided for manufacturing a solid-state imaging device is provided. The internal state of the silicon substrate, which depends on the initial oxygen concentration, the carbon concentration, the resistivity, and the pulling condition of the silicon substrate, is determined by comparing a white spot condition representing upper and lower limits of the density of white spots as device characteristics with the measured density of white spots.

7 Claims, 6 Drawing Sheets

(56) References Cited

U.S. PATENT DOCUMENTS

| | | | |
|---|---|---|---|
| 5,874,348 A | 2/1999 | Takizawa et al. | |
| 6,140,213 A | 10/2000 | Takizawa et al. | |
| 6,261,860 B1 * | 7/2001 | Nagata | 438/58 |
| 7,700,394 B2 * | 4/2010 | Sadamitsu et al. | 438/45 |
| 2003/0170928 A1 * | 9/2003 | Shimozono et al. | 438/73 |
| 2006/0189169 A1 * | 8/2006 | Adachi et al. | 438/795 |
| 2006/0273361 A1 | 12/2006 | Tanaka et al. | |

FOREIGN PATENT DOCUMENTS

| | | | |
|---|---|---|---|
| EP | 2096667 | 9/2009 | |
| JP | 6-338507 | 12/1994 | |
| JP | 08-104592 | 4/1996 | |
| JP | 09-115848 | 5/1997 | |
| JP | 11-103042 | 4/1999 | |
| JP | 2000-068280 | 3/2000 | |
| JP | 2003-244547 | 8/2003 | |
| JP | 2003-318181 | 11/2003 | |
| JP | 2006-261632 | 9/2006 | |
| JP | 2006-313922 | 11/2006 | |
| JP | 2007-001847 | 1/2007 | |
| JP | 2007-273959 | 10/2007 | |
| WO | WO 2006003812 A1 * | 1/2006 | 438/35 |
| WO | WO2006/025409 | 3/2006 | |

OTHER PUBLICATIONS

U.S. Appl. No. 12/396,656, filed Mar. 3, 2009, and entitled "Method of Manufacturing Silicon Substrate".

U.S. Appl. No. 12/391,723, filed Feb. 24, 2009, and entitled "Silicon Substrate and Manufacturing Method Thereof".

J. Vanhellemont et al., "Measurement, modeling and simulation of defects in as-grown Czochralski silicon," Journal of Crystal Growth, Elsevier, Amsterdam, NL, vol. 108, No. 3-4, Oct. 1, 1997, pp. 353-362.

T. Sinno et al., "Defect engineering of Czochralski single-crystal silicon," Materials Science and Engineering R: Reports, Elsevier Sequoia S.A., Lausanne, CH, vol. 28, No. 5-6, Jul. 14, 2000, pp. 149-198.

Japanese Office Action in Counterpart Application No. JP2008-054842 (and partial Englsih-language translation thereof), mailed on Apr. 23, 2013.

European Search Report in Counterpart Application No. EP09003141.0, mailed on May 23, 2013.

Korean Office Action in Counterpart Application No. 10-2009-0018227 (and partial Englsih-language translation thereof), mail on date Apr. 5, 2012.

* cited by examiner

FIG. 7

SILICON SUBSTRATE AND MANUFACTURING METHOD OF THE SAME

BACKGROUND OF THE INVENTION

1. Field of the Invention

The present invention relates to a manufacturing method of a silicon substrate, and more particularly, to a technique suitable for manufacturing a silicon substrate used for manufacturing a solid-state imaging device by improving gettering capability.

Priority is claimed on Japanese Patent Application No. 2008-054842, filed on Mar. 5, 2008, the content of which is incorporated herein by reference.

2. Description of the Related Art

A semiconductor device such as a solid-state imaging device made of silicon is manufactured by forming a circuit on a silicon substrate sliced from a silicon single crystal pulled by a CZ (Czochralski) method or the like. When heavy metal impurities are incorporated into the silicon substrate, white spots occur due to dark current. Due to the white spots, device characteristics of the solid-stage imaging device significantly deteriorate.

Heavy metal as impurities is incorporated into the silicon substrate by the following two causes: metal contamination during a manufacturing process of a silicon substrate including pulling of a single crystal, slicing, chamfering, and surface treatments such as polishing, grinding, and etching; and heavy metal contamination during a manufacturing process of a device such as a thinning process by scraping the rear surface of a wafer down to about 50 μm after forming the circuit on the silicon substrate.

In JP-A-6-338507, a technique for reducing white spots generated due to dark current that affects electrical characteristics of a solid-state imaging device is disclosed. In addition, an example of an IG (intrinsic gettering) method of forming an oxygen deposit on a silicon substrate is also disclosed. In JP-A-2006-313922, an EG (extrinsic gettering) method of forming a gettering site such as backside damage on the rear surface of a silicon substrate, and a technique related to carbon ion implantation are disclosed.

As described above, as a manufacturing method of a silicon substrate used for a solid-state imaging device, the IG (intrinsic gettering) method of forming an oxygen deposit by performing an oxygen precipitation heat treatment before epitaxial growth is known.

SUMMARY OF THE INVENTION

However, a design for a silicon substrate having a gettering capability high enough to prevent white spots during manufacturing of the solid-state imaging device, that is, setting a condition of silicon substrate manufacturing is not disclosed.

Therefore, it takes a lot of time to set a manufacturing condition of the silicon substrate used for the solid-state imaging device, and this may result in a reduction in yield, an increase in manufacturing costs, and degradation in device manufacturing efficiency. Accordingly, there has been a demand for solving the problems.

In addition, as disclosed in JP-A-2006-313922, when high-temperature heat treatment is performed on a carbon-implanted substrate, crystal defects (crystal lattice strain and the like) formed by carbon implantation are smoothed, and the degradation of functions thereof as a gettering sink, which is not preferable, occurs. Therefore, in consideration of the conditions of heat treatment in the subsequent step, enabling a design for a silicon substrate (wafer) satisfying the required device characteristics, that is, providing a pulling condition of a silicon single crystal used for manufacturing a silicon substrate satisfying the above-mentioned conditions, is required.

The invention is designed to solve the above-mentioned problems. An object of the invention is to provide a manufacturing method of a silicon substrate, in which a silicon substrate that prevents white spots in a solid-state imaging device and satisfies desired device characteristics can be easily designed. Simultaneously, another object of the invention is to simply and accurately determine on the basis of conditions of a silicon substrate (wafer) manufacturing step and a device step, a condition of a single crystal manufacturing process performed by a CZ method applying an initial oxygen concentration, a dopant concentration or a resistivity, and heat treatment as setting conditions, so as to obtain a silicon substrate having a desired gettering capability.

According to an aspect of the invention, there is provided a manufacturing method of a silicon substrate which is manufactured from a silicon single crystal grown by a CZ method and used for manufacturing a solid-state imaging device, the manufacturing method including the steps of: setting a white spot condition representing upper and lower limits of the density of white spots as device characteristics; setting a gettering capability of the silicon substrate, a BMD density and a BMD size of the silicon substrate by applying a heat treatment condition of a device manufacturing step; calculating from the conditions an initial oxygen concentration, an initial carbon concentration, a resistivity, and a pulling process condition of the silicon single crystal under pulling, thereby determining pulling process conditions including the initial oxygen concentration, a carbon concentration, the resistivity, and a pulling temperature condition of the single-crystal silicon in the pulling process; measuring the density of white spots in an evaluation device formed on a silicon substrate sliced from the silicon single crystal pulled under the determined pulling conditions; comparing the measurement result with the white spot condition and re-setting an IG condition when this value does not satisfy the white spot condition; and when the value satisfies the white spot condition, determining, on the basis of the pulling process conditions, the internal state of the silicon substrate which depends on the initial oxygen concentration, the carbon concentration, the resistivity, and the pulling condition of the silicon substrate to be provided to the solid-state imaging device to be manufactured.

According to another aspect of the invention, there is provided a manufacturing method of a silicon substrate which is manufactured from a silicon single crystal grown by a CZ method and provided for manufacturing a solid-state imaging device, the manufacturing method including: a step of forming an epitaxial layer on the surface of the silicon substrate sliced from the silicon single crystal doped with carbon when pulled by the CZ method, and forming a device unit on the surface; a WS condition setting step of setting a white spot condition representing upper and lower limits of the density of white spots as device characteristics; a device heat treatment condition setting step of setting a heat treatment condition in a device step of forming the device unit; an epi condition setting step of setting a forming condition of the epitaxial layer; an IG condition setting step of setting a gettering capability of the silicon substrate, and a BMD density and a BMD size of the silicon substrate; a calculating step of calculating a pulling process condition including an initial oxygen concentration, a carbon concentration, a resistivity, and a pulling temperature condition of the silicon single crystal under pulling, from the conditions set in the WS condition setting step, the device heat treatment condition setting step, the epi condition setting step, and the IG condition setting step; a parameter determining step of determining from the values derived in the calculating step, the pulling process condition of the following single crystal pulling step for determining a fitting parameter; the single crystal pulling step for determining a fitting parameter, the step including pulling the silicon single crystal by the CZ method under the pulling condition determined in the parameter determining step; an evaluation device manufacturing step of manufacturing, on the silicon substrate sliced from the silicon single crystal pulled in the single crystal pulling step for determining a fitting parameter, a circuit for device performance evaluation of the solid-state imaging device according to white spots; a WS performance measuring step of measuring the density of white spots of the evaluation device manufactured in the evaluation device manufacturing step; a determining step of comparing the measurement result in the WS performance measuring step with the white spot condition set in the WS condition setting step, returning to the device heat treatment condition setting step when the white spot condition is not satisfied, and performing determination proceeding in the following condition determining step when the white spot condition is satisfied; and the condition determining step of determining on the basis of the condition in the parameter determining step, the internal state of the silicon substrate to be provided to the solid-state imaging device to be manufactured, which depends on the initial oxygen concentration, the carbon concentration, the resistivity, and the pulling process condition.

In the above aspect, the carbon concentration may be in the range of $1.0 \times 10^{16}$ to $1.6 \times 10^{17}$ atoms/cm$^3$, the initial oxygen concentration may be in the range of $1.4 \times 10^{18}$ to $1.6 \times 10^{18}$ atoms/cm$^3$, and the resistivity may be in the range of 0.1 to 100 Ωcm.

In addition, for an intrinsic gettering sink, the BMD size may be in the range of 10 to 100 nm, and the BMD density may be in the range of $1.0 \times 10^6$ to $1.0 \times 10^{11}$ pieces/cm$^3$.

In addition, the calculation of the pulling process condition may be performed by the Fokker-Planck equation.

In addition, the heat treatment in the device heat treatment condition setting step may include pre-annealing performed before the device manufacturing step.

In addition, the pre-annealing may be performed at a temperature between 600 and 800° C., for a processing time of 0.25 to 3 hours, in a mixed atmosphere of oxygen and an inert gas such as argon or nitrogen.

A silicon substrate according to another aspect of the invention may be manufactured by any of the manufacturing methods.

Here, the oxygen concentration is based on ASTM F121-1979.

In addition, the BMD size in this case means a diagonal length of a deposit during TEM observation of a cross-section in a thickness direction of the silicon substrate and is represented as an average value of deposits in the observation field.

In the manufacturing method of the silicon substrate according to the invention, a nucleus (gettering sink of heavy metals) of a deposit caused by the addition of carbon is grown, and a silicon epitaxial layer is formed immediately above the nucleus, thereby easily providing a silicon substrate suitable for manufacturing a solid-state imaging device capable of suppressing heavy metal diffusion to a buried photodiode.

By using the silicon substrate for manufacturing the solid-state imaging device, defects caused by heavy metal contamination do not occur in a transistor and the buried photodiode included in the solid-state imaging device. Therefore, occurrence of white spots in the solid-state imaging device can be prevented in advance, thereby increasing the production yield of the solid-state imaging device.

Therefore, according to the invention, the silicon substrate which has a high gettering capability due to carbon, oxygen, and the formation of a complex thereof and can reduce an effect of metal contamination can be provided, so that the silicon substrate which can solve problems such as the increase in manufacturing costs and particle generation in the device step can be easily designed.

DETAILED DESCRIPTION OF THE INVENTION

Hereinafter, exemplary embodiments of a method of pulling a silicon single crystal related to the invention are described with reference to the accompanying drawings. In addition, the embodiments are described in detail for better understanding of the essential aspect of the invention and are not intended to limit the invention unless otherwise defined. FIGS. 1 and 2 are front cross-sectional views illustrating a silicon substrate in each step, which is subjected to a manufacturing method of a silicon substrate related to this embodiment. FIG. 3 is a flowchart illustrating the manufacturing method of a silicon substrate according to this embodiment. In FIG. 3, a symbol W0 denotes a silicon substrate.

In this embodiment, a design for a silicon substrate used for manufacturing of a CCD (solid-state imaging device) and a CMOS image sensor (CIS) is described.

The manufacturing method of the embodiment includes, as illustrated in FIG. 3, a WS condition setting step S01 of setting a white spot condition described later, a device heat treatment condition setting step S02, an epi condition setting step S03, an IG condition setting step S04, a calculating step S05, a parameter determining step S06, a single crystal pulling step S07 for determining a fitting parameter, an evaluation device manufacturing step S08, a WS performance measuring step S09, a determining step S10, and a condition determining step S11.

Figure 1A:
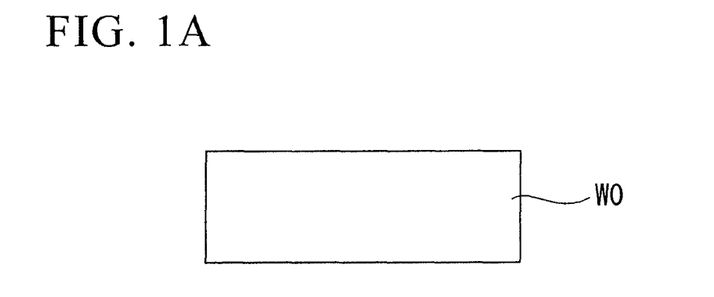
FIG. 1 is a front cross-sectional view illustrating a silicon substrate in a manufacturing method of a silicon substrate according to an embodiment of the invention.
Figure 2A:
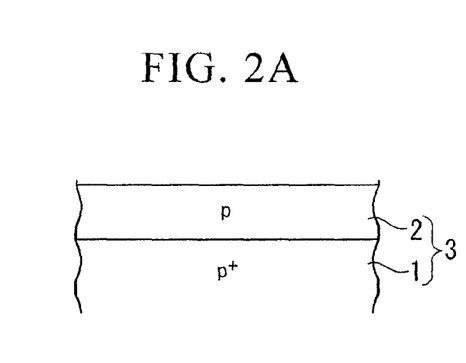
FIG. 2 is a view illustrating a manufacturing order of a solid-state imaging device.
Figure 2B:
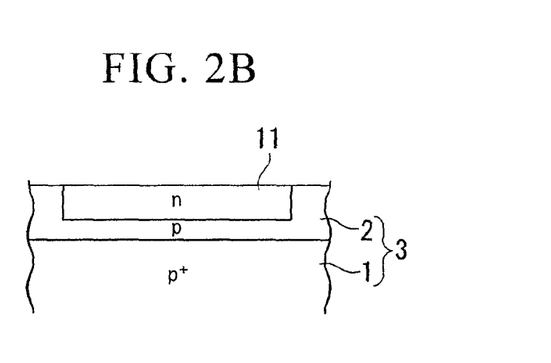
Figure 2C:
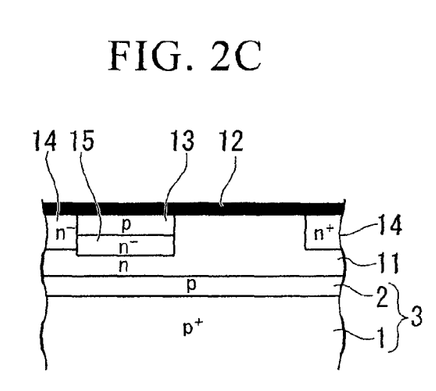
Figure 2D:
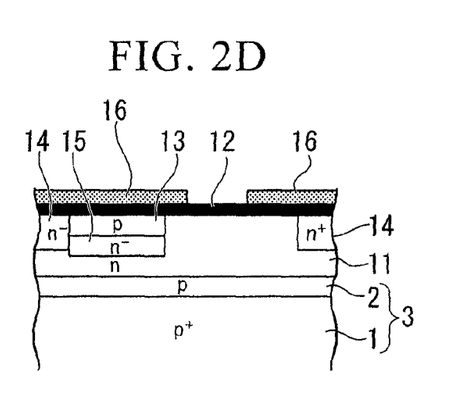
Figure 2E:
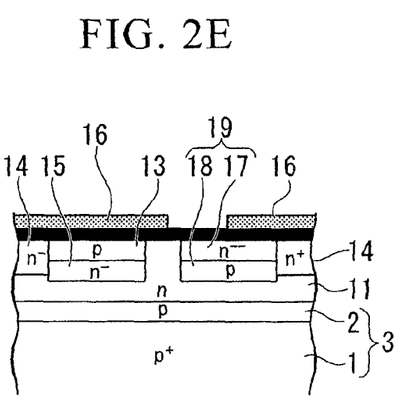

For the silicon substrate used in the embodiment, as described later, carbon is doped, predetermined dopants corresponding to a resistivity are doped, and an initial oxygen concentration is controlled, as a silicon single crystal is pulled by a CZ method. The silicon single crystal is subjected to a wafer manufacturing step, thereby obtaining a silicon substrate W0 containing carbon as illustrated in FIG. 1A.

Here, a dopant (B) is added during the single crystal growth so that the resistivity of the silicon substrate W0 is of a p$^+$ type.

In this embodiment of the invention, a $p^+$ type of a boron (B) concentration corresponds to a resistivity of 8 to 10 mΩcm, a p type thereof corresponds to a resistivity of 0.1 to 100 Ωcm, and a $p^-$ type thereof corresponds to a resistivity of 0.1 to 0.01 Ωcm.

A $p/p^-$ type is a wafer in which a p-type epitaxial layer is formed on a $p^-$-type substrate.

Figure 1B:
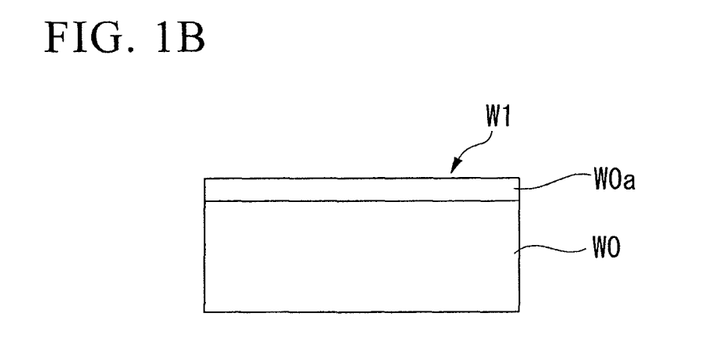
Figure 1C:
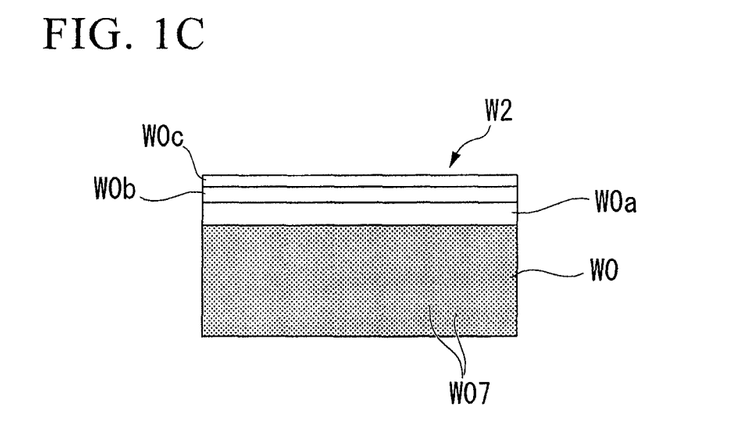

Moreover, an epitaxial layer W0a is formed on the silicon substrate W0 thereby forming a $p/p^+$-type silicon substrate W1, and as illustrated in FIG. 1C, an oxide film W0b and additionally a nitride film W0c are formed as needed on the epitaxial layer W0a of the silicon substrate W1 thereby forming a silicon wafer W2 to be provided for the device manufacturing step.

The thickness of the epitaxial layer W0a is preferably in the range of 2 to 10 μm in terms of improvement of spectral sensitivity characteristics of a device in the case where the device is a solid-state imaging device.

In a device step illustrated in FIG. 2, a buried photodiode is formed at the epitaxial layer of the silicon wafer W2, thereby obtaining a solid-state imaging device.

Figure 2F:
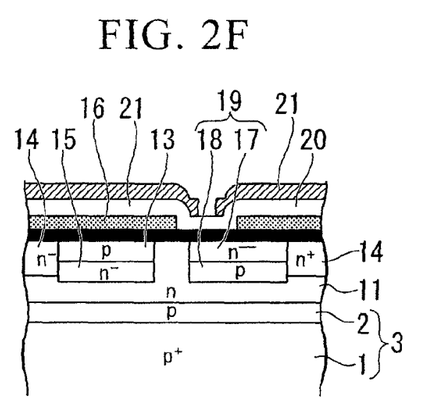
Figure 3:
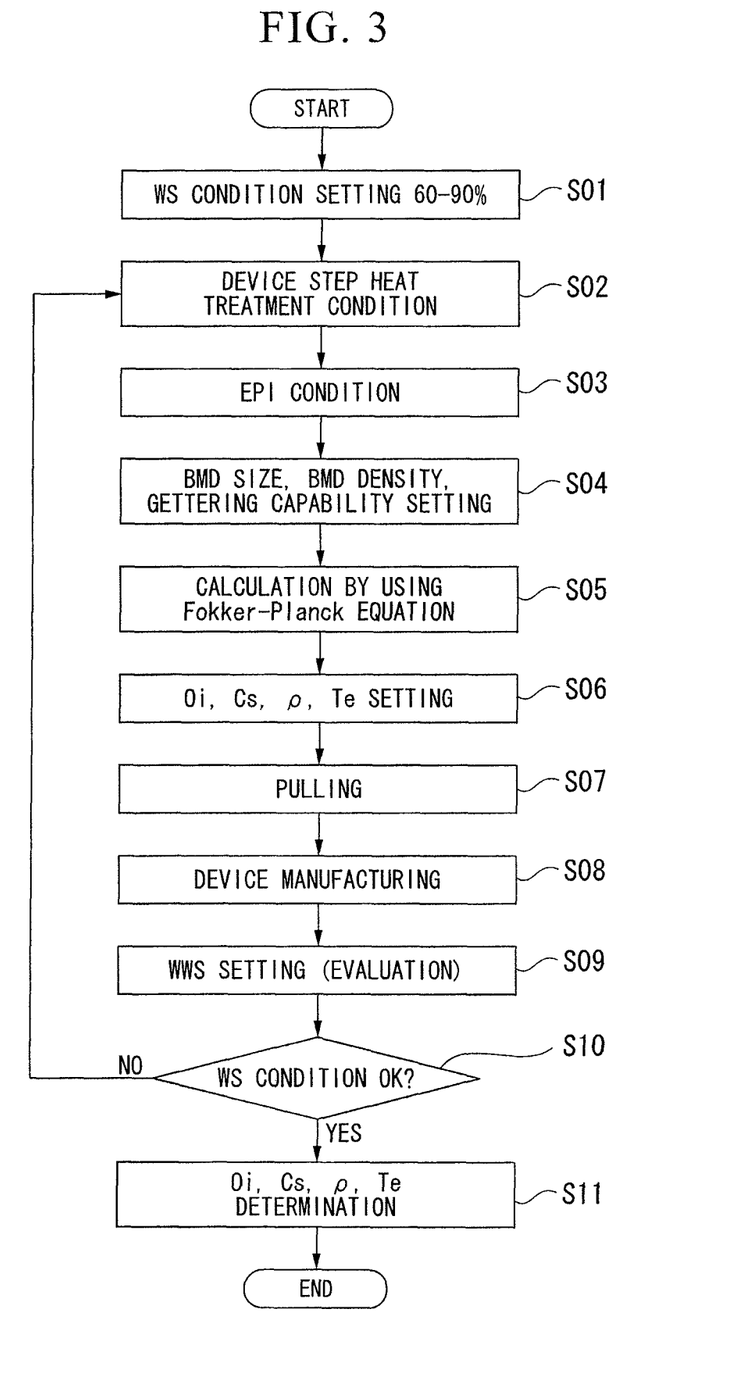
FIG. 3 is a flowchart illustrating a manufacturing order of a silicon substrate according to the invention.
Figure 6:
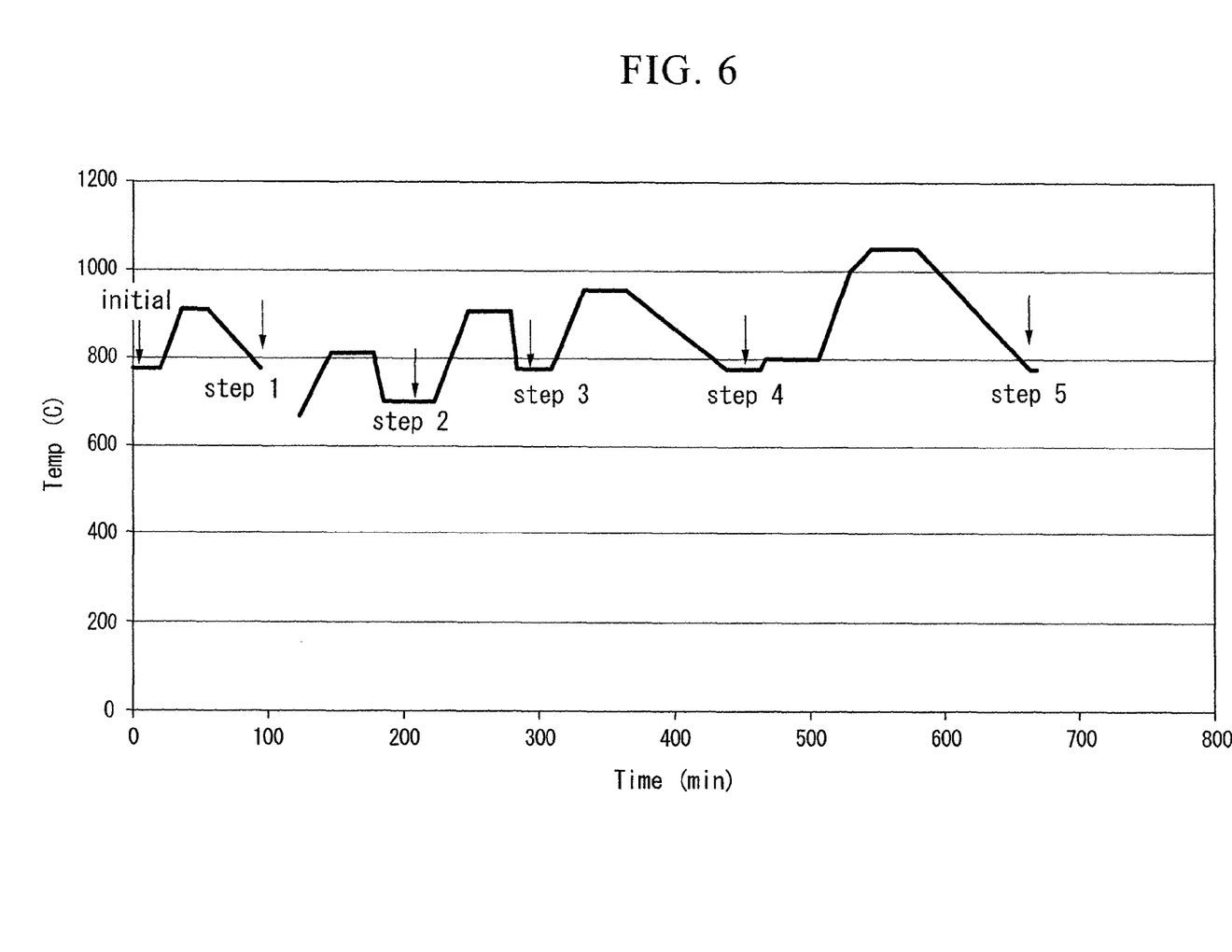
FIG. 6 is a view for explaining heat treatment according to the embodiment of the invention.

In addition, heat treatment conditions in the device step for obtaining the solid-state imaging device 10 illustrated in FIG. 2F correspond to the respective conditions illustrated in FIG. 6.

In this embodiment, the conditions are set so that the silicon substrate described above becomes a substrate suitable for the solid-state imaging device.

In this embodiment, first, in the WS condition setting step S01 illustrated in FIG. 3, a white spot condition representing upper and lower limits of the density of white spots (WS), which is an acceptable range of solid-state imaging device characteristics, is set.

The density of white spots has a different range depending on a manufactured solid-state imaging device. For example, when $10^5$ to $10^6$ pieces/cm$^2$ is accepted, this range is used to set the upper and lower limits, and particularly, the upper limit is associated with gettering.

Next, in the device heat treatment condition setting step S02 illustrated in FIG. 3, a heat treatment condition of the device step of forming the device unit is set. Specifically, as described above, the heat treatment condition is a heat treatment condition which corresponds to each condition in the device step illustrated in FIG. 6, a forming condition of the oxide film W0b, a forming condition of the nitride film W0c, or a heat treatment condition of pre-annealing. This heat treatment condition which includes a processing temperature, a processing time, a rate of temperature increase, a rate of temperature decrease, and a treatment atmosphere gas has effects on the behavior of an oxygen deposit BMD in the pulled single crystal or the silicon substrate (wafer).

Next, in the epi condition setting step S03 illustrated in FIG. 3, the forming condition of the epitaxial layer W0a is set. In this case, the processing temperature, the processing time, a rate of temperature increase, the rate of temperature decrease, and the treatment atmosphere gas, which have effects on the behavior of the oxygen deposit BMD in the pulled single crystal or the silicon substrate (wafer) are also considered. In addition, it is natural that as factors affecting the occurrence of white spots, the thicknesses of the epitaxial layer W0a, the oxide film W0b, and the nitride film W0c which have effects on the generation of dark current be considered as the forming condition.

Next, in the IG condition setting step S04 illustrated in FIG. 3, the BMD density and the BMD size of the silicon substrate W0 as a condition setting the gettering capability thereof, are set. Here, for example, an occurrence of heavy metal contamination on the substrate surface is assumed to show the gettering capability needed to satisfy the white spot condition represented by the upper and lower limits in the WS condition setting step S01, and the range is set so that the white spots do not occur even though the heavy metal is diffused by the subsequent heat treatment.

For example, when Ni is used as a contaminant source at a contamination level of $1\times10^{12}$ atoms/cm$^2$, and when Cu is used as a contaminant source at a contamination level of $1\times10^{13}$ atoms/cm$^2$, the condition is set to reduce the surface contamination down to a detection limit ($1\times10^{10}$ atoms/cm$^2$ for Ni, $1\times10^9$ atoms/cm$^2$ for Cu) after the heat treatment conditions as shown in FIG. 6. In this case, for an intrinsic gettering sink, the BMD size of the silicon substrate W0 can be determined to be in the range of 10 to 100 nm, and the BMD density can be determined to be in the range of $1.0\times10^{06}$ to $1.0\times10^{11}$ pieces/cm$^3$.

These conditions can be determined by obtaining a BMD density needed for gettering of Cu from a compulsive metal contamination experiment, or from an existing measured data.

Next, in the calculating step S05 illustrated in FIG. 3, from the condition set in the WS condition setting step S01, the device heat treatment condition setting step S02, the epi condition setting step S03, and the IG condition setting step S04, pulling process conditions including initial oxygen concentration Oi, a carbon concentration Cs, resistivity ρ, and a pulling temperature condition Te (crystal thermal history), are calculated.

Specifically, the behavior of an oxygen deposit is calculated based on the behavior of an oxygen deposit nucleus in the pulled single crystal and a thermal history in the following treatment, to obtain the pulling process condition to determine a desired oxygen deposit state.

Next, in the parameter determining step S06 illustrated in FIG. 3, from the values derived in the calculating step S05, the pulling process conditions to be used in the following single crystal pulling step S07 for determining a fitting parameter including an initial oxygen concentration Oi, a carbon concentration Cs, a resistivity ρ, a pulling temperature condition Te (crystal thermal history), are determined.

Here, it is preferable that certain ranges be given for each conditions.

By applying the ranges, the pulling conditions such as increasing the values in the respective ranges at every 1/10 interval for example, are set.

Next, in the single crystal pulling step S07 for determining a fitting parameter illustrated in FIG. 3, under a plurality of the pulling conditions including the initial oxygen concentration Oi, the carbon concentration Cs, the resistivity ρ, and the pulling temperature condition Te determined in the parameter determining step S06, a plurality of silicon single crystals are pulled using the CZ method. Otherwise, silicon single crystals are pulled changing crystal lengths and pulling conditions so that substrates (wafers) satisfying the plurality of the pulling conditions can be cut therefrom.

Next, in the evaluation device manufacturing step S08 illustrated in FIG. 3, wafers are cut from the silicon single crystal pulled in the single crystal pulling step S07 for determining a fitting parameter, and on the surface of the wafer, an evaluation device having a circuit for device performance evaluation according to white spots is formed as a solid-sate imaging device.

The circuit for evaluation is the device unit illustrated in FIG. 2 or forms a pn junction measuring a dark current. A MOS capacitor, for example, having a gate insulating film made of a $SiO_2$ film having a thickness of 20 nm and a gate electrode made of an Al film, and means for forming a CCD imaging sensor on an epitaxial substrate may also be employed.

Next, in the WS performance measuring step S09 illustrated in FIG. 3, the density of white spots in the evaluation device manufactured in the evaluation device manufacturing step S08 is measured.

The measurement may be performed by a method of measuring the density of white spots from leak current of a photodiode. For example, the number of white spots per unit area or the number of white spots per unit device on the entire surface of the silicon substrate may be measured.

Otherwise, when leak current of higher than 10 μA (microamperes) flows through the evaluation device, that is the pn junction formed on the entire surface of the silicon substrate at a predetermined density, white spots (starry defects) are evaluated, and the number of the white spots may be measured.

Next, in the determining step S10 illustrated in FIG. 3, the measurement result of the WS performance measuring step S09 is evaluated. In the evaluation, the measurement result is compared with the white spot condition set in the WS condition setting step S01. When the value of the measurement result does not satisfy the white spot condition, the pulling condition under which the evaluation device is formed is destroyed, and the process returns to the device heat treatment condition setting step S02 to reset the fitting parameter and calculate and reset the pulling condition. When the value of the measurement result of the WS performance measuring step S09 satisfies the white spot condition, the following condition determining step S11 is performed.

Figure 7:
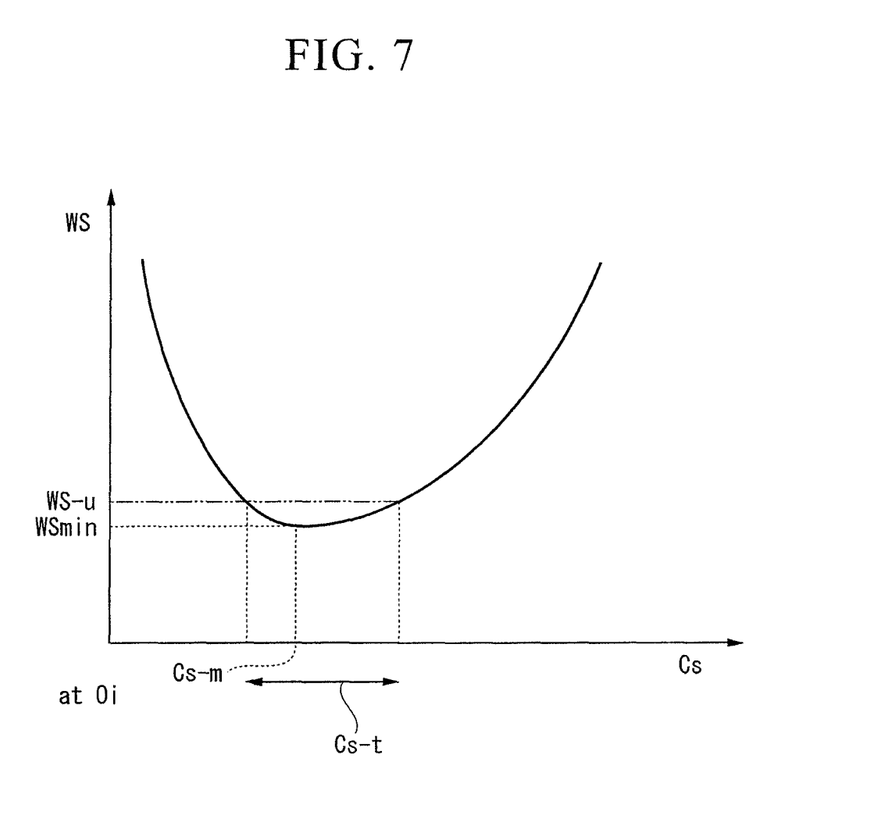
FIG. 7 is a graph illustrating a relationship between the number WS of white spots and a carbon concentration Cs at a specific oxygen concentration Oi.

In the determining step S10, in the case where the number WS of white spots, measured when the initial oxygen concentration, the carbon concentration Cs, and the like are applied in the WS performance measuring step S09, is equal to or less than the upper limit WS-u of the white spot condition set in the WS condition setting step S01 within the range, Cs-t of the pulling condition as illustrated in FIG. 7, it is determined that the range Cs-t of the pulling condition satisfies the white spot condition. In addition, it is determined that the range in which the number WS of white spots is equal to or greater than the upper limit WS-u, does not satisfy the white spot condition. The example illustrated in FIG. 7 represents the relationship between the number WS of white spots and the carbon concentration Cs, the upper limit WS-u of the white spot condition, and the preferable carbon concentration Cs-t at a predetermined oxygen concentration Oi. Moreover, it is preferable that this type of graph is generated by changing the range of the oxygen concentration Oi, and the overall determination is made in consideration of the obtained relationships.

In addition, in the determining step S10, when the initial oxygen concentration, the carbon concentration Cs, and the like are changed, as illustrated in FIG. 7, the pulling condition (carbon concentration) Cs-m in which the number WS of white spots is at the minimum value WSmin may be determined as the optimal value satisfying the white spot condition. Also, upper and lower ranges of the carbon concentration optimal value Cs-m may be determined as the pulling condition range satisfying the white spot condition. The upper and lower ranges of the optimal value Cs-m may be about ±10% thereof.

Next, in the condition determining step S11 illustrated in FIG. 3, on the basis of the condition of the parameter determining step S06, the internal state of the silicon substrate which is provided to the solid-state imaging device to be manufactured, which depends on the pulling process conditions such as the initial oxygen concentration Oi, the carbon concentration Cs, the resistivity ρ, a vacancy density distribution, interstitial silicon density distribution, distribution of OSF generation state, COP generable area distribution, the pulling speed V, the pulling temperature Te, a thermal history of the single crystal, a temperature gradient G, an applied magnetic condition, and an atmosphere gas condition, is determined.

Accordingly, the condition of the silicon substrate provided for manufacturing the solid-state imaging device can be designed by the device manufacturing conditions to obtain a needed gettering capability.

Hereinafter, the manufacturing process of the silicon substrate will be described.

In order to manufacture the silicon substrate W0 as illustrated in FIG. 1A, first, polysilicon that is the raw material of a silicon crystal is placed in a quartz crucible, an adequate amount of graphite powder is applied to the surface of the polysilicon. Simultaneously B (boron) at a concentration corresponding to the $p^+$ type is added as a dopant, and a CZ crystal with added carbon is pulled in a hydrogen atmosphere by, for example, the Czochralski method (CZ method). Here, the CZ crystal means a crystal that is manufactured by the Czochralski method and includes a magnetic field-applied CZ crystal.

In this embodiment, a P-type silicon single crystal containing boron is manufactured as follows. Carbon is added to a raw material, and a silicon single crystal is produced from raw material with added carbon. In addition, the oxygen concentration Oi is controlled as the silicon single crystal is pulled. Now, the pulling of the high-concentration boron CZ silicon single crystal with added carbon will be described.

Here, a wafer having a diameter of 300 mm is described. However, the invention is not limited thereto.

Figure 4:
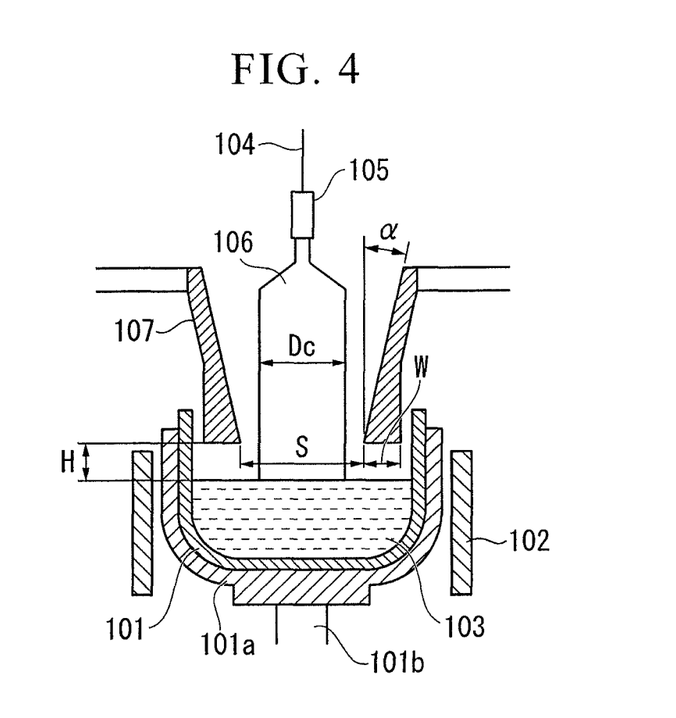
FIG. 4 is a longitudinal cross-sectional view illustrating a CZ pulling furnace.

FIG. 4 is a longitudinal cross-sectional view illustrating a CZ furnace suitable to describe a method of producing a silicon single crystal according to this embodiment. The CZ furnace includes a crucible (quartz crucible) 101 disposed at the center in a chamber and a heater 102 disposed outside the crucible 101. The crucible 101 has a double structure in which a graphite crucible 101a on the outer side retains the quartz crucible 101 accommodating a raw material melt 103, and the crucible 101 is rotated and moved up and down by a supporting shaft 110b called a pedestal.

A cylindrical thermal shield 107 is provided above the crucible 101. The thermal shield 107 has a structure in which the outer shell is made of graphite, and the inner part is filled with graphite felt. The inner surface of the thermal shield 107 is formed as a tapered surface having a diameter that is gradually reduced from the upper end to the lower end. The upper outer surface of the thermal shield 107 is also formed as a tapered surface corresponding to the tapered inner surface, and the lower outer surface thereof is formed as a substantially straight (vertical) surface such that the thickness of the thermal shield 107 is gradually increased from the upper direction to the lower direction.

The CZ furnace can grow a 300-mm single crystal having a target diameter of, for example, 310 mm and a body length of, for example, 1200 mm.

The thermal shield 167 has the following dimensions. The outside diameter of a portion that is placed inside the crucible is, for example, 570 mm, the minimum inside diameter S of the lowermost portion is, for example, 370 mm, the width (thickness) W of the thermal shield 107 in the radial direction is, for example, 100 mm, and the inclination angle of the inner surface of an inverted truncated cone in the vertical direction is, for example, 21°. In addition, the inside diameter of the crucible 101 is, for example, 650 mm, and a height H of the lower end of the thermal shield 107 from a melt surface is, for example, 60 mm.

Next, a method of setting operation conditions for growing the carbon-added high-concentration boron CZ silicon single crystal will be described.

First, for example, 250 kilograms of high-purity polycrystal silicon is put into the crucible, and a dopant (B) is added at a concentration that allows the resistivity of the crystal to correspond to a $p^+$ type. In addition, a dopant is added to a silicon melt so that the carbon concentration is within a predetermined range. At the same time, the crystal rotation speed, the crucible rotation speed, the heating conditions, the applied magnetic field conditions, and the pulling speed are controlled to obtain a predetermined initial oxygen concentration.

The internal pressure of the furnace is set to be in the range of 1.33 to 26.7 kPa (10 to 200 torr) in an inert gas atmosphere, which is a reduced pressure range. In addition, hydrogen gas is mixed with an inert gas (for example, Ar gas) to occupy a 3 to 20 volume % and introduced into the furnace. The pressure is equal to or higher than 1.33 kPa (10 torr), preferably, in the range of 4 to 26.7 kPa (30 to 200 torr), and more preferably, in the range of 4 to 9.3 kPa (30 to 70 torr). With regard to the lower limit of the pressure, when the partial pressure of hydrogen is reduced, the concentration of hydrogen in the melt and crystal is reduced, and thus, in order to prevent the reduction of the hydrogen concentration, the lower limit of the pressure is defined. With regard to the upper limit of the pressure, when the internal pressure of the furnace is increased, the gas flow rate in the melt of an inert gas such as Ar is decreased. Then, the reactant gas such as carbon released from a carbon heater or a carbon member and SiO evaporated from the melt, cannot be easily removed. In this case, the concentration of carbon in the crystal is increased to be higher than a desired value, and SiO is agglutinated at an inner portion of the furnace that is above the melt and has a temperature of about 1100° C. or less and dust is generated and falls into the melt. As a result, crystal dislocation may occur. Therefore, in order to prevent the above problems, the upper limit of the pressure is defined.

Next, silicon is heated and melted by the heater 102 to obtain a melt 103. Next, a seed crystal held by a seed chuck 105 is dipped into the melt 103, and the crystal is pulled as the crucible 101 and a pulling shaft 104 are rotated. Any one of the {100}, {111}, and {110}-oriented crystals is used, and seed narrowing is performed to prevent dislocation-free crystallization. Then, a shoulder portion is formed, and the shoulder portion is changed to obtain a target body diameter of, for example, 310 mm.

Thereafter, a body portion having a length of, for example, 1200 mm is grown at a constant pulling speed, and tail narrowing is performed to reduce the diameter of the body portion in normal conditions, thereby completing the crystal growth. Here, the pulling speed is appropriately determined depending on, for example, resistivity, the diameter of the silicon single crystal, and a hot zone structure (thermal environment) of the single crystal pulling apparatus used. For example, qualitatively, a pulling speed including the range in which an OSF ring is generated on a single crystal surface may be employed. In addition, the lower limit of the pulling speed may be determined to be equal to or higher than the pulling speed at which the OSF ring region is generated on the single crystal surface but a dislocation cluster is not generated.

The concentration of hydrogen in the inert atmosphere may be set to be equal to or higher than 3% and equal to or lower than 20% at the internal pressure of the furnace that is in the range of 4.0 to 9.33 kPa (30 to 70 torr). The internal pressure of the furnace is equal to or higher than 1.33 kPa (10 torr), preferably, in the range of 4.0 to 26.7 kPa (30 to 200 torr), and more preferably, in the range of 4.0 to 9.3 kPa (30 to 70 torr). With regard to the lower limit, when the partial pressure of hydrogen is reduced, the concentration of hydrogen in the melt and crystal is reduced. Therefore, in order to prevent the reduction of the hydrogen concentration, the lower limit of the pressure is defined. With regard to the upper limit, when the internal pressure of the furnace is increased, the gas flow rate in the melt of the inert gas such as Ar is decreased. Then, a reactant gas such as carbon released from a carbon heater or a carbon member and SiO evaporated from the melt, cannot be easily exhausted. In this case, the concentration of carbon in the crystal is increased to be higher than a desired value, and SiO is agglutinated at an inner portion of the furnace that is above the melt and has a temperature of about 1100° C. or less and dust is generated and falls into the melt. As a result, crystal dislocation may occur. Therefore, in order to prevent the above problems, the upper limit of the pressure is defined. It is preferable that the partial pressure of hydrogen be equal to or higher than 40 Pa and equal to or lower than 400 Pa.

When silicon growth is performed in an inert atmosphere containing hydrogen, the concentration of hydrogen in the silicon single crystal can be controlled by the partial pressure of hydrogen in the atmosphere. When hydrogen is introduced into a crystal, hydrogen in the atmosphere is dissolved in a silicon melt and becomes a normal (equilibrium) state. In addition, in a crystal, hydrogen concentrations in a liquid phase and a solid phase are distributed by concentration segmentation during congelation.

The concentration of hydrogen in a melt is determined depending on the partial pressure of hydrogen in a gas phase by Henry's law. The concentration of hydrogen in the crystal immediately after congelation can be controlled to a desired constant value in the axial direction of the crystal by controlling the partial pressure of hydrogen in the atmosphere.

According to the silicon single crystal growth method, since a silicon single crystal is pulled in an inert atmosphere containing hydrogen, COP and a dislocation cluster are not included in the entire region of a crystal in the diametric direction. In addition, since the single crystal is pulled while widening the range of a PI region pulling speed capable of pulling a single crystal in an interstitial silicon-dominated region (PI region), a straight portion of the single crystal can become the interstitial silicon-dominated region (PI region) without a dislocation cluster. In addition, according to the silicon single crystal growth method, the width of the OSF ring is reduced. In the related art, when a grown-in defect-free single crystal is pulled, the PI region pulling speed needs to be set in a very narrow range. However, in this embodiment, it is possible to very easily grow a grown-in defect-free single crystal at a pulling speed faster than that in the related art. In addition, when a silicon single crystal is pulled under the conditions in which an OSF ring region is generated in the crystal plane, it is possible to decrease the width of the OSF ring and reduce the influence of the OSF ring.

In this embodiment, the PI region pulling speed range in a hydrogen atmosphere is compared with that in an inert atmosphere without hydrogen under the conditions in which the value of a temperature gradient G in the axial direction of a crystal immediately after congelation does not vary.

Figure 5:
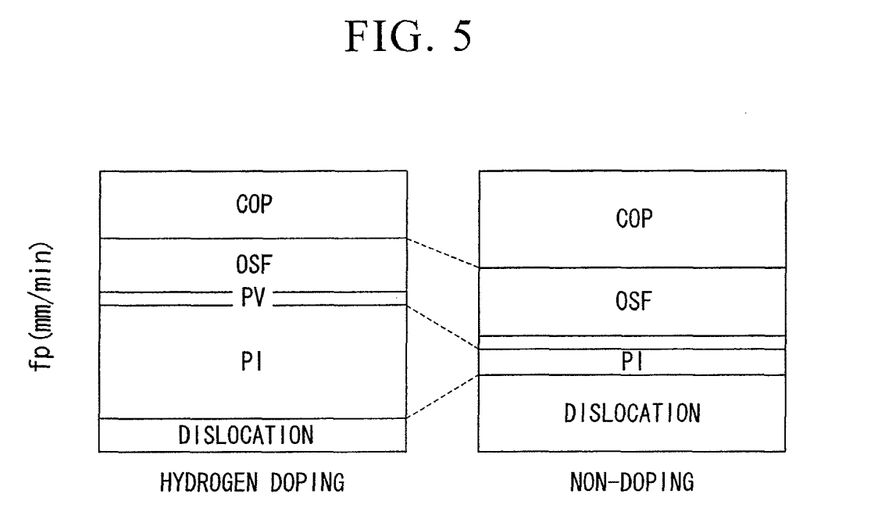
FIG. 5 is a schematic view illustrating a change in pulling speed region according to the addition of hydrogen.

Specifically, in the hydrogen atmosphere, the PI region pulling speed range capable of pulling a grown-in defect-free single crystal that is composed of an interstitial-silicon-type grown-in defect-free region (PI region) is four times or more that in the atmosphere without hydrogen. In addition, as shown in FIG. 5, the PI region pulling speed range can be enlarged to have a margin that is 4.5 times that to perform pulling, thereby pulling a desired single crystal at a pulling speed.

In this case, it is possible to reduce the region in which the OSF ring is generated. In addition, the size of a PV region (vacancy-type grown-in defect-free region) does not vary with the addition of hydrogen.

In this embodiment, as described above, the addition of hydrogen makes it easy to pull a grown-in defect-free single crystal, and the addition of carbon makes it possible to reduce the influence of the OSF ring. Therefore, when an epitaxial layer is grown on the wafer, defects caused by the OSF ring can be reduced and a single crystal with desired quality can be pulled by the synergistic effect of the addition of hydrogen and the addition of carbon. As a result, operating efficiency is improved, and it is possible to significantly reduce the manufacturing cost of a silicon single crystal or a silicon substrate manufactured from the silicon single crystal, which is preferable.

In a wafer manufacturing step, the silicon substrate W0 containing carbon as illustrated in FIG. 1A is obtained from the pulled carbon-added high-concentration boron CZ silicon single crystal.

In the wafer manufacturing step, a general method is performed to process the silicon substrate (wafer) W0. In this method, a cutting apparatus such as an ID saw and a wire saw is used to slice a silicon single crystal to obtain a silicon wafer. Next, annealing is performed on the obtained silicon wafer, and then surface treatments such as polishing and cleaning are performed thereon. In addition to these steps, there are various steps such as wrapping, cleaning, and grinding. The order of the processes may be changed, and the processes may be appropriately omitted for the purpose of use.

The obtained silicon substrate 1 has a boron (B) concentration corresponding to a p$^+$ type. In addition, the carbon concentration is in the range of $1.0 \times 10^{16}$ to $1.6 \times 10^{17}$ atoms/cm$^3$, and the oxygen concentration is in the range of $1.4 \times 10^{18}$ to $1.6 \times 10^{18}$ atoms/cm$^3$.

Since carbon in a solid solution state is contained in silicon, carbon is introduced into a silicon lattice so as to be substituted for silicon. Specifically, the radius of a carbon atom is smaller than that of a silicon atom. Therefore, when carbon is disposed at a substitution position, the stress field of a crystal becomes a compression stress field, and interstitial oxygen and impurities are likely to be gettered in the compression stress field. For example, in the device step, a high-density oxygen deposit with dislocation is easily generated from carbon at the substitution position, and it is possible to obtain a high gettering effect in the silicon substrate W0. Accordingly, in the device manufacturing step S4 described later, a sufficient gettering capability can be achieved.

The concentration of carbon added in the above-mentioned range needs to be regulated. This is because when the carbon concentration is lower than the above-mentioned range, the formation of an oxygen/carbon-based deposit is not accelerated and the above-mentioned high-density oxygen/carbon-based deposit cannot be formed.

On the other hand, when the carbon concentration is higher than the above-mentioned range, the formation of an oxygen/carbon-based deposit is accelerated, and a high-density oxygen/carbon-based deposit can be obtained. However, the growth of the deposit is suppressed, and strain around the deposit tends to be reduced. Therefore, the effect of strain is reduced, and the effect of gettering impurities is also reduced.

Furthermore, it is necessary to regulate the oxygen concentration in the silicon substrate W0 to be in the above-mentioned range. This is because when the oxygen concentration is lower than the above-mentioned range, the formation of a carbon/oxygen-based deposit is not accelerated and the above-mentioned high-density deposit cannot be obtained.

On the other hand, when the oxygen concentration is higher than the above-mentioned range, the size of an oxygen deposit is decreased, and the effect of strain in an interface between a maternal silicon atom and a deposit is reduced. As a result, there is a concern that a gettering effect due to strain is also reduced.

In addition, with regard to the effect on the deposits, a higher boron concentration can be obtained, thereby accelerating the formation of complex defects by boron/carbon/oxygen.

Next, in the wafer manufacturing step, mirror processing is performed on the surface of the silicon substrate W0 which is a carbon-added CZ crystal, and RCA cleaning which is a combination of, for example, SC1 and SC2, is performed thereon. Thereafter, in an epitaxial layer forming step, in order to grow an epitaxial layer, the silicon substrate W0 is put into an epitaxial growth furnace, and various CVD (chemical vapor deposition) methods are used to grow an epitaxial layer W0a having a boron (B) concentration corresponding to the p type, thereby obtaining the p/p$^+$-type silicon substrate W1 as illustrated in FIG. 1B.

On the p/p$^+$-type silicon substrate W1, as illustrated in FIG. 1C, the oxide film W0b and the nitride film W1c may be additionally formed on the epitaxial layer W0a as needed, thereby obtaining the silicon wafer W2.

In this case, the silicon substrate W0 of the silicon substrate W1 or W2 provided in the device manufacturing step is a CZ crystal containing boron and solute carbon. However, an oxygen deposit nucleus or an oxygen deposit formed in the CZ crystal during crystal growth is shrunken by heat treatment when epitaxial growth is performed. Therefore, the oxygen deposit formed in the silicon substrate W0 in the stage of the silicon substrate W1 is not observed by an optical microscope.

Accordingly, in order to ensure gettering sinks for gettering heavy metal, after the epitaxial layer W0a is grown, the following conditions are applied to enable the acceleration of the precipitation. As a temperature condition, a low-temperature heat treatment is performed preferably at a temperature between 600 and 800° C. for 0.25 to 3 hours, thereby allowing a boron/carbon/oxygen-based oxygen deposit W07 to deposit from carbon at a substitution position.

In addition, in the embodiment of the invention, the boron/carbon/oxygen-based deposit means a complex (cluster) containing boron/carbon.

When the silicon substrate W1 containing solute carbon is used as a base material, the oxygen deposit W07 is spontaneously deposited from the entire silicon substrate W0 in an initial stage of the device manufacturing step. Therefore, it is possible to form gettering sinks having high gettering capability for metal contamination in the device manufacturing step over the entire thickness of the silicon substrate W0 from immediately below the epitaxial layer. As a result, gettering is performed near the epitaxial layer.

In order to achieve the gettering, it is preferable that the oxygen deposit (BMD) W07 which is the complex includes boron, carbon, and oxygen, have a size in the range of 10 to 100 nm and a density in the range of $1.0 \times 10^6$ to $1.0 \times 10^{11}$ pieces/cm$^3$ in the silicon substrate W0.

When the size of the oxygen deposit W07 is equal to or greater than the lower limit of the above-mentioned range, it is possible to increase the probability of gettering interstitial impurities (for example, heavy metal) using the effect of strain occurring in an interface between a maternal silicon atom and the oxygen deposit. On the other hand, when the size of the oxygen deposit W07 is equal to or greater than the above-mentioned range, the strength of the substrate is degraded or dislocation occurs in the epitaxial layer, which is not preferable.

It is preferable that the density of the oxygen deposit W07 in the silicon substrate be in the above-mentioned range because the gettering of heavy metal in the silicon crystal depends on strain occurring in the interface between the maternal silicon atom and the oxygen deposit and an interface level density (volume density).

Next, as the device step, a general solid-state imaging device manufacturing process can be employed. For example, a CCD manufacturing process is illustrated in FIG. 2, but the invention is not limited thereto.

Next, in the device manufacturing step, first, as illustrated in FIG. 2A, the silicon substrate 3 having the p-type silicon substrate 1 and the p-type epitaxial layer 2 formed on the silicon substrate 1 as illustrated in FIG. 1B is prepared, and a first n-type well region 11 is formed at a predetermined position of the epitaxial layer 2 as illustrated in FIG. 2B. Thereafter, as illustrated in FIG. 2C, a gate insulating film 12 is formed thereon, and n-type and p-type impurities are selectively implanted into the first n-type well region 11 by ion implantation to form a p-type transmission channel region 13, an n-type channel stop region 14, and a second n-type well region 15, thereby constituting a vertical transmission register.

Next, as illustrated in FIG. 2D, transmission electrodes 16 are formed at predetermined positions on the surface of the gate insulating film 12. Thereafter, as illustrated in FIG. 2E, p-type and n-type impurities are selectively implanted between the p-type transmission channel region 13 and the second n-type well region 15 to form a photodiode 19 having a laminated structure of an n-type positive charge storage region 17 and a p-type impurity diffusion region 18.

In addition, as illustrated in FIG. 2F, an interlayer insulating film 20 is formed thereon, and a light-shielding film 21 is formed on the surface of the interlayer insulating film 20 except for a portion immediately above the photodiode 19, thereby manufacturing a silicon substrate W3 as a solid-state imaging device 10.

The heat treatment conditions of the device step for manufacturing the solid-state imaging device 10 correspond to the respective conditions illustrated in FIG. 6.

Specifically, for the silicon substrate W1 having the epitaxial layer W0a formed thereon, Initial, Step 1, Step 2, Step 3, Step 4, and Step 5 illustrated in FIG. 6 correspond to the end times of steps of a process of forming the photodiode and the transmission transistor.

In the device manufacturing step, a heat treatment is generally performed at a temperature between 600 to 1000° C. during, for example, a gate oxide film forming step, a device separating step, a polysilicon gate electrode forming step, and the like. The heat treatment makes it possible to deposit the oxygen deposit W07 described above, and the oxygen deposit can function as a gettering sink in the subsequent step, thereby showing the gettering capability without pre-annealing.

In this embodiment, it is preferable that the thickness of the epitaxial layer W0a be in the range of 2 to 10 μm in terms of improvement of the spectral sensitivity characteristics of a device when the device is a solid-state imaging device.

In the device step, a buried photodiode is formed at the epitaxial layer W0a of the silicon wafer W2, thereby obtaining the solid-state imaging device.

In addition, it is preferable that the thicknesses of the oxide film W0b and the nitride film W0c be determined in consideration of restrictions in the design of the driving voltage of a transmission transistor. Specifically, it is preferable that the thickness of the oxide film W0b be in the range of 50 to 100 nm. In addition, it is preferable that the thickness of the nitride film W0c, specifically, the polysilicon gate film W1b of the solid-state imaging device be in the range of 1.0 to 2.0 μm.

When the above-mentioned heat treatment is performed as pre-annealing before the device manufacturing step, it is preferable that the heat treatment be performed at a temperature between 600 and 800° C. for 0.25 to 3 hours in a mixed atmosphere of oxygen and an inert gas such as argon or nitrogen. Accordingly, the heat treatment makes it possible to give an IG (gettering) effect to the silicon substrate. Here, the heat treatment step is not necessarily needed for a high-concentration boron substrate and can be omitted.

When the heat treatment for giving the IG effect is performed at a temperature lower than the above-mentioned temperature range, regardless of whether the heat treatment is performed in or before the device manufacturing step, a complex of boron/carbon/oxygen is insufficiently formed. When metal contamination occurs in the substrate, it is difficult to obtain sufficient gettering capability, which is not preferable. On the other hand, when the heat treatment is performed at a temperature higher than the above-mentioned temperature range, an excessively large amount of oxygen deposit is agglutinated. As a result, the density of the gettering sinks is insufficient, which is not preferable.

In addition, the temperature and the processing time of the heat treatment are equal to or higher than those of a temperature of 600° C. and a processing time of 30 minutes and may be changed as long as the same precipitation effect as that under this condition can be obtained. The temperature and the process time of the heat treatment are equal to or lower than those in a condition of a temperature of 800° C. and a processing time of 4 hours and may be changed as long as the same precipitation effect as that under this condition can be obtained.

Hereinafter, in the calculating step S05 illustrated in FIG. 3, the order for calculating pulling process conditions including the initial oxygen concentration Oi, the carbon concentration Cs, the resistivity ρ, and the pulling temperature condition Te of the silicon single crystal under pulling, from the conditions set in the WS condition setting step S01, the device heat treatment condition setting step S02, the epi condition setting step S03, and the IG condition setting step S04, by using the Fokker-Planck equation, will be described.

Conventionally, an oxygen precipitation behavior is formulated by the Fokker-Planck equation reported by Schrems. Accordingly, in the description, an example using a model based on this equation is explained.

In this model, an oxygen precipitation behavior is statistically described by a deposit size distribution function f(r,t). Here, r is the radius of an oxygen deposit when the shape of the oxygen deposit is assumed to be a sphere, and t is a heat treatment time. The partial differential equation of f(r,t) with respect to time is described by using the following Fokker-Planck equations (1) and (2).

Equation 1

$$\frac{\partial}{\partial t}f(r,t) = -\frac{\partial}{\partial r}J(r,t) \quad (1)$$

Equation 2

$$J = -B(r,t)\frac{\partial f}{\partial r} + A(r,t)f \quad (2)$$

Here, A(r,t) and the oxygen diffusion term B(r,t) satisfy a relationship of the following equation (3).

Equation 3

$$B(r,t) = -\frac{kT}{\frac{\partial \Delta G}{\partial r}}A(r,t) \quad (3)$$

(where k is a Boltzmann constant, and T is an absolute temperature.)

A free energy $\Delta G(r,t)$ of Gibbs with respect to the deposit having a radius of r is given as the sum of a volumetric energy and an interface energy as represented in the following equation (4).

Equation 4

$$\Delta G(r,t) = -\frac{4\pi r^3}{3v_O}kT\ln\frac{C_O(t)}{C_O^{eq}} + 4\pi r^2 \sigma \quad (4)$$

where $C_O^{eq}$ is a thermal equilibrium concentration of oxygen in silicon, $\sigma$ is an interface energy at an interface between a matrix and an oxygen deposit, and $V_O$ is a volume of the half a molecule of $SiO_2$.

In addition, in the statement of $\Delta G$ in the equation (4), an influence of intrinsic point defects or a stress of deposits are not considered for simplification.

A residual interstitial oxygen concentration $C_O(t)$ is calculated by the following equation (5) with the maintenance of the total concentration $C_T$ of oxygen atoms.

Equation 5

$$C_O(t) = C_T - \int_{r_{min}}^{\infty}\left(\frac{4\pi}{3v_o}r^3\right)f(r,t)dr \quad (5)$$

where $r_{min}$ is a radius of a molecule of $SiO_2$.

A(r,t) is around a deposit growth speed dr/dt and can be represented as the following equation (6).

Equation 6

$$A(r,t) = \frac{dr}{dt} = \frac{D_O v_O}{r}\left[C_O(t) - C_O^{if}(r)\right] \quad (6)$$

where $D_O$ is a diffusion constant of oxygen in silicon.

An oxygen concentration $C_O^{if}(r)$ at an interface between a matrix and a deposit is obtained on the assumption of a condition $\partial \Delta G/\partial r = 0$ of thermodynamic equilibrium in the interface and can be represented as the following equation (7).

Equation 7

$$C_O^{if}(r) = C_O^{eq}\exp\left(\frac{2\sigma v_O}{kTr}\right) \quad (7)$$

In order to describe an initial condition and a boundary condition of the Fokker-Planck equation, a pseudo-equilibrium distribution function $f_0(r,t)$ is employed. By using this function, the initial condition can be described as $f(r,0)=f_0(r,0)\delta rr_{min}$, where $\delta$ is a delta function. The boundary condition is $f(r_{min},t)=f_0(r_{min},t)$ and $f(\infty,t)=0$.

Here, $f_0(r,t)$ is given as the following equation (8).

Equation 8

$$f_0(r,t) = \frac{4\pi r^2}{v_O}C_O(t)P\exp\left(-\frac{\Delta G(r,t)}{kT}\right) \quad (8)$$

The description so far is the model based on the Fokker-Planck equation reported by Schrems (see: M. Schrems, in Oxygen in Silicon, Semiconductors and Semimetals, Chap. 10, Vol. 42, R. K. Willardson, A. C. Beer, and E. R. Weber, Series Editors, F. Shimura, Volume Editor, p. 391, Academic Press, New York (1994)).

In the model of Schrems, P in the equation (8) is considered as a variable influenced by a thermal history during the crystal pulling step and other impurities than oxygen and therefore treated as a fitting parameter for fitting the calculation result into an experimental result. Therefore, in order to obtain P, the result of the single crystal pulling step S07 for determining a fitting parameter is applied to calculate $f_0(r,t)$.

Accordingly, from the conditions set in the WS condition setting step S01, the device heat treatment condition setting step S02, the epi condition setting step S03, and the IG condition setting step S04, pulling process conditions including the initial oxygen concentration Oi, the carbon concentration Cs (dopant concentration), the resistivity ρ, and the pulling temperature condition Te (crystal thermal history) of the silicon single crystal under pulling, is obtained to reach a desired oxygen deposit and internal defect density during or after a particular wafer step, an oxygen deposit, the initial oxygen concentration dependency of internal defect density, the dopant concentration or resistivity dependency, and the crystal thermal history dependency.

Accordingly, on the basis of the conditions of the wafer manufacturing step and the device step, a condition of the single crystal manufacturing step subjected to the Czochralski method including the initial oxygen concentration, the dopant concentration or resistivity, and the heat treatment condition can be determined simply and clearly so as to obtain a silicon wafer having a desired gettering capability.

In addition, for a model of the oxygen deposit in the silicon single crystal described above, a numerical computation program using a model in which free energy during the formation of a silicon oxide, and more specifically, strain energy depend on a dopant concentration or a resistivity, may be executed to enhance precision.

In the embodiment of the invention, the wafer can be used for, for example, a multi chip package (MCP) such as NAND-FLASH and NOR-FLASH. In this case, since the device structure is CMOS, determination setting of dark current in the evaluation device is changed for adaptation. Therefore, the design for the silicon substrate subjected to the manufacturing method of the invention can be adapted. Accordingly, it is possible to provide a silicon substrate capable of maintaining a high gettering capability.

The $p^+$-type is preferable for the silicon substrate in terms of device designing. Specifically, a phenomenon in which a floating charge that may occur during the operation of a device drives a undesired parasitic transistor, that is, so-called a latchup, is prevented by using the $p^+$ wafer (silicon substrate), and the design for the device can be easy. In addition, when a trench-structure capacitor is used, an extension of a depletion layer around the trench, which occurs when a voltage is applied, can be prevented by the $p^+$ wafer.

In addition, in a silicon single crystal doped with a high-concentration B (boron), agglutination of an oxygen deposit by the heat treatment easily occurs when compared with other dopants. The reason seems to be that dopants such as the high-concentration boron and oxygen are clustered and form defects having an oxygen deposit as a nucleus.

Moreover, significant agglutination of an oxygen deposit due to the boron in the heat treatment occurs in a silicon crystal with a high-oxygen concentration.

The inventors analyzed and examined the states and behaviors of carbon, oxygen, and boron. The examination results proved that when a wafer was manufactured from a silicon single crystal that was pulled under the conditions of a boron (B) concentration corresponding to a resistivity of 8 to 10 m$\Omega$cm, a carbon concentration of $0.5\times10^{16}$ to $1.6\times10^{17}$ atoms/cm$^3$, and an oxygen concentration of $1.4\times10^{18}$ to $1.6\times10^{18}$ atoms/cm$^3$, and an epitaxial layer was formed on the wafer and subjected to the heat treatment at a temperature between 600 and 800° C., it was possible to manufacture a silicon substrate having sufficient BMD size and density to form gettering sinks required to getter heavy metal and achieve sufficient gettering capability.

Here, a new $p^+$ substrate containing a high-concentration of boron can accelerate precipitation without performing heat treatment.

Further, in the embodiment of the invention, when the concentration of carbon added to a high-concentration boron-added silicon crystal is in the range of $0.5\times10^{16}$ to $1.6\times10^{17}$ atoms/cm$^3$, gettering sinks having carbon, boron, or oxygen as nuclei are formed during a crystal growth process. These gettering sinks stably exist even when a high-temperature heat treatment is performed. Therefore, these gettering sinks exist even after epitaxial growth. Thus, oxide deposits act as deposit nuclei immediately after epitaxial growth, and the nuclei are grown during the device heat treatment step and serve as gettering sinks for heavy metal contamination during the device heat treatment step.

In this embodiment of the invention, the manufacturing method may include: a step of pulling a silicon single crystal having a B concentration corresponding to a resistivity of 8 to 10 m$\Omega$cm, a C concentration of $0.5\times10^{16}$ to $1.6\times10^{17}$ atoms/cm$^3$, and an oxygen concentration of $1.4\times10^{18}$ to $1.6\times10^{18}$ atoms/cm$^3$ by using the CZ method; and a heat treatment step of performing heat treatment to form an oxygen deposit on a silicon substrate sliced from the pulled silicon single crystal.

In the embodiment of the invention, the heat treatment for forming the oxygen deposit may be performed at a temperature between 600 and 800° C., a processing time of 0.25 to 3 hours, in a mixed atmosphere of oxygen and an inert gas such as argon or nitrogen.

In addition, in the embodiment of the invention, before performing the heat treatment for forming the oxygen deposit, a step of forming a silicon epitaxial layer having a B concentration corresponding to a resistivity of 0.1 to 100 $\Omega$cm on the surface of the obtained silicon substrate may be included.

Further, in this embodiment of the invention, when the silicon single crystal is grown, hydrogen may be added to an inert gas atmosphere. In this case, in the silicon single crystal pulling step, the pressure of the inert gas atmosphere having hydrogen added thereto may be in a range of 1.33 to 26.7 kPa, which is a reduced pressure range, and the concentration of hydrogen gas in the atmosphere may be in the range of 3 to 20 volume %.

In addition, the silicon substrate of the invention is manufactured by a manufacturing method having any one of the following steps. In the embodiment, a silicon substrate of a solid-state imaging device is a silicon device in which a gettering layer having a BMD size of 10 to 100 nm and a BMD density of $1.0\times10^6$ to $1.0\times10^{11}$ pieces/cm$^3$ is formed at a position immediately below a buried photodiode of the solid-state imaging device. A silicon epitaxial layer having a B concentration corresponding to a resistivity of 0.1 to 100 $\Omega$cm is formed immediately above the silicon substrate manufactured by the manufacturing method. The gettering layer may be formed immediately below the epitaxial layer.

Hereinafter, a model for determining whether or not a high gettering capacity is exhibited will be described.

When a $p^-$ substrate having a dopant boron (B) concentration of about $1\times10^{15}$ atoms/cm$^3$ and a resistivity of about 10 $\Omega$cm is doped with carbon at a carbon concentration of about $1\times10^{17}$ atoms/cm$^3$ (0.5 to $1\times10^{17}$ atoms/cm$^3$), which is higher than the boron (B) concentration, the initial oxygen concentration of about 1.4 to $1.6\times10^{18}$ atoms/cm$^3$ is applied. In this case, since the concentrations of carbon and oxygen are higher than the boron (B) concentration and substantially equal to each other, it is thought that carbon-oxygen can be easily paired on this substrate. Therefore, it is thought that as a bond state associated with the gettering sink in the Si crystal, a carbon-oxygen pair is formed.

Here, since carbon has a smaller atomic radius than Si, the vicinity of carbon at an lattice point of Si is distorted, thereby forming a strain field. As DK (doner killer) or the heat treatment of the device manufacturing step is performed on the substrate in this state, interstitial oxygen is gathered on the strain field in the vicinity of the carbon-oxygen pair, thereby forming BMD. As described above, since carbon is doped on the silicon substrate at the device region or a position closer to the wafer surface where heavy metal contamination easily occurs, and the vicinity of the carbon is distorted, heavy metal diffuses to be gettered. As a result, the gettering effect can be obtained. Specifically, the carbon-oxygen pair becomes a nucleus generation center (new creation center) of the oxygen deposit.

On the other hand, when a $p^+$ substrate or $p^{++}$ substrate highly doped with boron at a dopant (B) concentration of about $1\times10^{18}$ atoms/cm$^3$ (0.5 to $5\times10^{18}$ atoms/cm$^3$) is manufactured, the B concentration becomes higher than that of the $p^-$ substrate by approximately three or more digits. Accordingly, since the boron (B) concentration that is increased to be higher than that of the $p^-$ substrate so as to be substantially the same as the carbon concentration and the oxygen concentration has an effect thereon, it is thought that paring of boron-oxygen or carbon-boron is easier than that of carbon-oxygen. In addition, complexes of carbon-oxygen, boron-oxygen, carbon-boron, and carbon-boron-oxygen, and many complexes in which those complexes are associated with silicon are formed. These complexes also have strain fields similarly to the carbon-oxygen pair, so that all of the pairs and the complexes become deposit nuclei. Specifically, since many strain fields can be formed on the highly-doped substrate, an overwhelming number of deposit nuclei exist when compared with a substrate having a B concentration corresponding to p⁻. Therefore, the density of deposits to serve as the gettering sink overwhelmingly increase.

In addition, it is expected that a vacancy in a silicon crystal and interstitial Si are associated with the complex formation.

In addition, in the embodiment of the invention, the precipitation nucleus is a complex defect due to boron/carbon/oxygen.

In addition, in the manufacturing process of the imaging device, preventing heavy metal contamination is very important. Therefore, in addition to the IG due to boron and oxygen, a texture as EG is formed on the other side of the substrate. Consequently, sufficient gettering capability can be achieved.

Moreover, the $p/p^+$-type silicon substrate serves as the silicon substrate for a device sensitive to heavy metal contamination due to the high gettering capability. In addition, in an electronic device manufacturing step, as miniaturization of wiring rules is developed, flatness of the silicon substrate affects device reservation, so that high flatness is required. As in the embodiment of the invention, when the silicon substrate is the $p^+$ substrate which is doped with C and has a high B concentration, PBS that degrades the flatness is not formed, and it is possible to obtain sufficient gettering capability.

In addition, the sufficient gettering capability needs to be exhibited before the device manufacturing step is started and to be maintained during the device step. Therefore, in the manufacturing step of the p-type silicon substrate, when C is not doped, in order to enhance precipitation, it is preferable that the oxygen concentration Oi be increased to be in the range of 10 to $20 \times 10^{18}$ atoms/cm$^3$. However, when the oxygen concentration in the substrate is increased, there is a concern that epi defects in which a dislocation extends to the epitaxial layer may occur. On the other hand, as in the embodiment of the invention, the above-mentioned concentration of carbon is doped. Therefore, there is an advantage in that generation of stacking fault (SF) of equal to or greater than 0.5 µm can be suppressed.

In addition, in the embodiment, since the above-mentioned concentration of carbon is doped, an extension of secondary effects from the deposit nuclei can be suppressed. A deposit having a size of 0.5 to 5 µm has a secondary dislocation that occurs in the vicinity of a strain field in order to release the generated strain. However, by performing doping with C, a number of deposits having sizes of 0.5 to 100 nm can be formed. Therefore, although strain is released, only a small secondary dislocation occurs. As a result, the dislocation does not extend to the epitaxial layer. Moreover, a number of small deposit nuclei exist at a concentration of about $1.0 \times 10^{10}$ to $1.0 \times 10^{13}$/cm$^3$. Therefore, it is possible to exhibit sufficient gettering capability.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A manufacturing method of a silicon substrate which is manufactured from a silicon single crystal grown by a CZ method and used for manufacturing a solid-state imaging device, the manufacturing method comprising the steps of:

setting a white spot condition representing upper and lower limits of the density of white spots as device characteristics;

setting a gettering capability of the silicon substrate, a BMD density and a BMD size of the silicon substrate by applying a heat treatment condition of a device manufacturing step;

calculating pulling process conditions which include an initial oxygen concentration, an initial carbon concentration, a resistivity, and a thermal history of the silicon single crystal under pulling from the conditions which are the gettering capability of the silicon substrate, the BMD density and the BMD size and the heat treatment condition of a device manufacturing step, thereby determining the pulling process conditions including the initial oxygen concentration, a carbon concentration, the resistivity, and a thermal history of the single-crystal silicon in the pulling process;

manufacturing an evaluation device formed on a silicon substrate sliced from the silicon single crystal pulled under the determined pulling conditions, and measuring the density of white spots in the evaluation device, wherein when a leak current of higher than 10 µA flows through the evaluation device, white spots are evaluated, and the number of white spots are measured;

comparing the measurement result with the white spot condition and re-setting an IG condition when this value does not satisfy the white spot condition; and when the value satisfies the white spot condition, determining on the basis of the pulling process conditions the internal state of the silicon substrate which depends on the initial oxygen concentration, the carbon concentration, the resistivity, and the thermal history of the silicon substrate to be provided to the solid-state imaging device to be manufactured; and manufacturing a silicon substrate by using the pulling process conditions determined.

2. A manufacturing method of a silicon substrate which is manufactured from a silicon single crystal grown by a CZ method and provided for manufacturing a solid-state imaging device, the manufacturing method comprising:

a step of forming an epitaxial layer on the surface of the silicon substrate sliced from the silicon single crystal doped with carbon when pulled by the CZ method, and forming a device unit on the surface;

a WS condition setting step of setting a white spot condition representing upper and lower limits of the density of white spots, which is an acceptable range as device characteristics;

a device heat treatment condition setting step of setting a heat treatment condition in a device step of forming the device unit;

an epi condition setting step of setting a forming condition of the epitaxial layer;

an IG condition setting step of setting a gettering capability of the silicon substrate, a BMD density and a BMD size of the silicon substrate;

a calculating step of calculating a pulling process condition including an initial oxygen concentration, a carbon concentration, a resistivity, and a thermal history of the silicon single crystal under pulling, from the conditions set in the WS condition setting step, the device heat treatment condition setting step, the epi condition setting step, and the IG condition setting step;

a parameter determining step of determining from the values derived in the calculating step, the pulling process condition of the following single crystal pulling step for determining a fitting parameter;

the single crystal pulling step for determining a fitting parameter, the step including pulling the silicon single crystal by the CZ method under the pulling condition determined in the parameter determining step;

an evaluation device manufacturing step of manufacturing on the silicon substrate sliced from the silicon single crystal pulled in the single crystal pulling step for determining a fitting parameter, a circuit for device performance evaluation of the solid-state imaging device according to white spots;

a WS performance measuring step of measuring the density of white spots of the evaluation device manufactured in the evaluation device manufacturing step, wherein when a leak current of higher than 10 μA flows through the evaluation device, white spots are evaluated, and the number of white spots are measured;

a determining step of comparing the measurement result in the WS performance measuring step with the white spot condition set in the WS condition setting step, returning to the device heat treatment condition setting step when the white spot condition is not satisfied, and performing determination proceeding in the following condition determining step when the white spot condition is satisfied; and the condition determining step of determining on the basis of the condition in the parameter determining step, the internal state of the silicon substrate to be provided to the solid-state imaging device to be manufactured, which depends on the initial oxygen concentration, the carbon concentration, the resistivity, and the thermal history; and a manufacturing step of manufacturing a silicon substrate by using the pulling process conditions determined.

3. The manufacturing method according to claim 2, wherein the carbon concentration is in the range of $1.0 \times 10^{16}$ to $1.6 \times 10^{17}$ atoms/cm$^3$, the initial oxygen concentration is in the range of $1.4 \times 10^{18}$ to $1.6 \times 10^{18}$ atoms/cm$^3$, and the resistivity is in the range of 0.1 to 100 Ωcm.

4. The manufacturing method according to claim 2, wherein, for an intrinsic gettering sink, the BMD size is in the range of 10 to 100 nm, and the BMD density is in the range of $1.0 \times 10^6$ to $1.0 \times 10^{11}$ pieces/cm$^3$.

5. The manufacturing method according to claim 2, wherein the calculation of the pulling process condition is performed by the Fokker-Planck equation.

6. The manufacturing method according to claim 2, wherein the heat treatment in the device heat treatment condition setting step includes pre-annealing performed before the device manufacturing step.

7. The manufacturing method according to claim 6, wherein the pre-annealing is performed at a temperature between 600 and 800° C., for a processing time of 0.25 to 3 hours, in a mixed atmosphere of oxygen and an inert gas such as argon or nitrogen.

* * * * *

UNITED STATES PATENT AND TRADEMARK OFFICE
CERTIFICATE OF CORRECTION

PATENT NO. : 8,864,907 B2  
APPLICATION NO. : 12/397399  
DATED : October 21, 2014  
INVENTOR(S) : K. Kurita et al.

It is certified that error appears in the above-identified patent and that said Letters Patent is hereby corrected as shown below:

In the Claims

Column 8, line 44, please change "shaft 110b" to -- shaft 101b --  
Column 8, line 60, please change "thermal shield 167" to -- thermal shield 107 --  
Column 11, line 53, please change "step S4" to -- step S08 --

Signed and Sealed this  
Twenty-first Day of July, 2015

Michelle K. Lee  
*Director of the United States Patent and Trademark Office*